United States Patent [19]

Ulmer

[11] 4,385,245

[45] May 24, 1983

[54] MOS POWER-ON RESET CIRCUIT

[75] Inventor: Richard W. Ulmer, Austin, Tex.

[73] Assignee: Motorola, Inc., Schaumburg, Ill.

[21] Appl. No.: 269,165

[22] Filed: Jun. 1, 1981

[51] Int. Cl.$^3$ ............ H03K 5/153; H03K 17/22; H03K 17/284; H03K 17/687

[52] U.S. Cl. .................. 307/594; 307/362; 307/597; 307/585

[58] Field of Search ............ 307/592, 593, 594, 595, 307/596, 597, 268, 296 R, 360, 362, 585; 328/48

[56] References Cited

U.S. PATENT DOCUMENTS

| | | | |
|---|---|---|---|
| 3,894,247 | 7/1975 | De Jong | 307/592 |
| 4,001,609 | 1/1977 | Sickert | 307/268 |
| 4,103,187 | 7/1978 | Imamura | 328/48 X |
| 4,210,829 | 7/1980 | Wong et al. | 307/594 X |
| 4,296,338 | 10/1981 | Thomas | 307/594 X |
| 4,300,065 | 11/1981 | Remedi et al. | 307/594 X |
| 4,365,175 | 12/1982 | Kucharewski | 307/593 X |

Primary Examiner—Larry N. Anagnos
Assistant Examiner—David R. Bertelson
Attorney, Agent, or Firm—Anthony J. Sarli, Jr.; Jeffrey Van Myers; James L. Clingan, Jr.

[57] ABSTRACT

A power-on reset circuit which deletes the need for resistors uses a current source transistor and a capacitor to provide a minimum time for the power-on reset signal. A load transistor replaces a resistor in a portion of the circuit which provides a reference.

6 Claims, 2 Drawing Figures

- PRIOR ART -

MOS POWER-ON RESET CIRCUIT

TECHNICAL FIELD

This invention relates to power-on reset circuits, and more particularly to power-on reset circuits for use on CMOS integrated circuits.

BACKGROUND AND OBJECTS OF THE INVENTION

Power-on reset circuits for providing a power-on reset signal have become necessary in some applications where certain circuit elements must begin operation in synchronization as power is applied. The power-on reset signal is held at a first level until the applied power reaches a predetermined voltage level at which time the power-on reset signal is brought to a second level. Information is thereby available to other circuitry that the predetermined voltage level has been reached and that there is then sufficient voltage for operation to begin.

Because some circuits require a certain amount of time to reach proper operating condition after the predetermined voltage is reached in a case where the predetermined voltage is reached very quickly, the power-on reset signal must remain at the first level for a minimum time duration which is sufficient to enable all relevant circuitry to reach proper operating condition.

In the prior art, the power-on reset circuits which are used on integrated circuits require inordinate amounts of chip area, partially due to the use of resistors. Resistors on integrated circuits require substantially more chip area than do transistors or capacitors. One resistor is usually required for the portion of the circuit which ensures that the power-on reset signal does not reach the second level until the power reaches the predetermined voltage level, and another resistor is required for the portion of the circuit which ensures that the power-on reset signal is held at the first level for at least the time duration which is sufficient to enable all relevant circuitry to reach proper operating condition.

An object of the invention is to provide a power-on reset circuit which requires less chip area of an integrated circuit to fabricate.

A further object of the invention is to eliminate the use of a resistor in the portion of the circuit which ensures that the power-on reset signal does not reach the second level until the power reaches the predetermined voltage level.

A still further object of the invention is to eliminate the use of a resistor in the portion of the circuit which ensures that the power-on reset signal is held at the first level for at least the time duration which is sufficient to enable all relevant circuitry to reach proper operating condition.

SUMMARY OF THE INVENTION

According to a broad aspect of the invention a reference means for providing a reference voltage is coupled to a comparator means which provides a comparator signal which is proportional to a difference between a power supply voltage and the reference voltage and thereby indicates whether or not the power supply voltage has reached a predetermined voltage level. A timer means provides a signal for a time duration proportional to a change in the power supply voltage and to the reference means. Logic means provides the power-on reset signal in response to the timer signal and to the comparator signal.

In another aspect of the invention, the timer means comprises a discharge transistor having a first electrode coupled to a ground potential and a control electrode coupled to the reference voltage and further comprises a capacitance means coupled to the power supply and to the discharge transistor at a second electrode of the discharge transistor.

In yet another aspect of the invention, the reference means comprises a reference transistor having a first electrode coupled to ground potential and having a control electrode and a second electrode coupled together forming reference node for providing the reference voltage and further comprises a complementary transistor having a first electrode coupled to the power supply, having a control electrode coupled to ground potential, and having a second electrode coupled to the reference node.

DESCRIPTION OF A PREFERRED EMBODIMENT

Figure 1:
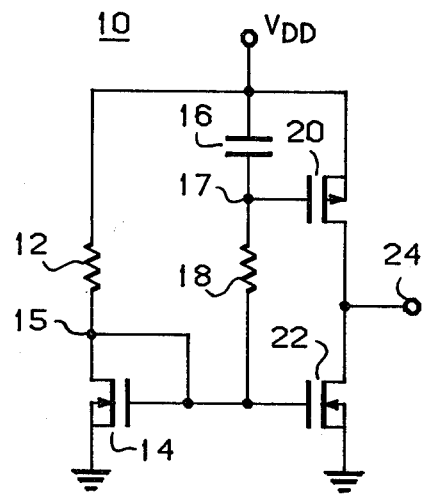
FIG. 1 is a schematic diagram of a power-on reset circuit of the prior art.

FIG. 1 shows in circuit diagram form a prior art power-on reset circuit 10 for providing a power-on reset signal. One terminal of a resistor 12 is connected to a power supply $V_{DD}$ and the other terminal to an IGFET 14 to form a reference node at 15 for providing a reference voltage. The IGFET 14 has its gate and drain connected to the resistor to form the reference node and has a source connected to ground potential. The gain of IGFET 14 and the resistance of resistor 12 are selected by conventional means so that the reference voltage is at approximately the threshold voltage $V_T$ of the IGFET 14 over a wide range of voltages of $V_{DD}$. $V_{DD}$ may be, for example, 3 to 18 volts and the threshold voltage may be, for example, one volt.

One terminal of a capacitor 16 is connected to $V_{DD}$, the other to one terminal of a resistor 18 to form an RC timing node 17. The other terminal of the resistor 18 is connected to the reference node 15. Because $V_{DD}$ is capacitively coupled to the RC timing node, rapid changes in the voltage of the power supply $V_{DD}$ will cause the same change in voltage at the RC timing node 17. The voltage at the RC timing node will subsequently approach the reference voltage of node 15 in accordance with the RC time constant of resistor 18 and capacitor 16.

A transistor pair comprising IGFET 20 and IGFET 22 are connected to provide the power-on reset signal in response to the application of power at $V_{DD}$, the voltage at the RC timing node, and the reference voltage. IGFET 20, for example a P channel IGFET, and IGFET 22 for example an N channel IGFET, have first electrodes connected together forming an output node which provides the power-on reset signal at output terminal 24. IGFET 20 has a gate connected to the RC timing node and a second electrode connected to the power supply $V_{DD}$. IGFET 22 has a gate connected to the reference node and a second electrode connected to ground potential. Ground potential is convenient to use as the voltage for a negative supply for explanation purposes, but other voltages less than $V_{DD}$ could also be used.

In the case where $V_{DD}$ rises slowly compared to the RC time constant, the power-on signal at 24 is provided at a low level from the time at which the power supply $V_{DD}$ reaches a threshold voltage $V_{TN}$ of IGFET 22 until $V_{DD}$ reaches a level of a threshold voltage $V_{TP}$ of IGFET 20 above the reference voltage. When $V_{DD}$ rises slowly, the voltage drop across resistor 18 is negligible so that the gate voltage of IGFET 20 is essentially at the reference voltage. IGFET 20 will then turn on when its threshold voltage is reached, which is when $V_{DD}$ reaches the threshold voltage $V_{TP}$ above the gate voltage, i.e., when $V_{DD}$ reaches $V_{TP} + V_T$.

The configuration of IGFET 14, resistor 12, and IGFET 22 is well known as a current mirror, so called because the current through IGFET 22 will be limited to approximately the same as or some scale of the current through IGFET 14. If the gains of the two IGFETS are the same, the current through each will be the same; if the gains are scaled, the current will be scaled accordingly.

When $V_{DD}$ reaches the voltage at which IGFET 20 turns on at approximately $V_T + V_{TP}$, IGFET 20 begins supplying current to IGFET 22. As $V_{DD}$ continues to increase, IGFET 20 is turned on harder, supplying current to the point at which IGFET 22 begins current limiting. From this point on as $V_{DD}$ increases, IGFET 20 causes only a negligible additional voltage drop whereas the voltage across IGFET 22 approaches $V_{DD}$, thereby providing the power-on reset signal at a high level.

In the case where $V_{DD}$ rises very rapidly, the time duration for it to traverse from the threshold voltage of IGFET 22 $V_{TN}$ to the level which is a threshold voltage $V_{TP}$ above the reference voltage may be too short for the circuit to provide the power-on reset signal at a low level for a desired length of time. The RC network is provided to ensure that the power-on reset signal is provided at the low level for at least the desired length of time even for instantaneous rises in $V_{DD}$. The RC time constant is chosen so that the voltage at the RC timing node does not drop one threshold voltage $V_{TP}$ below $V_{DD}$ for at least the desired length of time. When the RC timing node decays below that level, IGFET 20 turns on, quickly saturating IGFET 22 and thereby providing the consequent high level power-on reset signal. Before IGFET 20 turns-on but after $V_{DD}$ rises, IGFET 22 is turned on and provides the power-on reset signal at the low level.

The power-on reset circuit of the prior art thus provides a power-on reset signal which is low for at least a desired length of time and which does not go to a high level until a minimum operating voltage is reached. This circuit, however, uses two resistors, each of which typically requires an order of magnitude more chip area than an IGFET.

Figure 2:
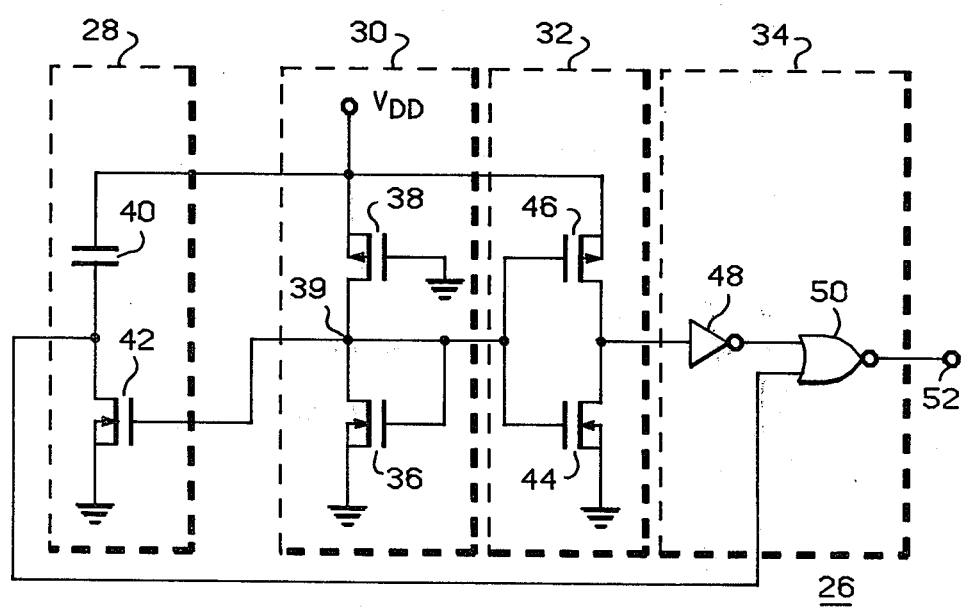
FIG. 2 is a schematic diagram of the power-on reset circuit of a preferred embodiment of the invention.

FIG. 2 shows a power-on reset circuit 26 which requires no resistors. The circuit comprises a timer circuit 28, a reference circuit 30, a comparator circuit 32, and logic circuit 34.

The timer circuit 28 comprises a capacitor 40 and an N channel IGFET 42. One terminal of capacitor 40 is connected to a power supply $V_{DD}$ and the other to a first electrode of IGFET 42. IGFET 42 has a second electrode connected to a common or ground potential and has a control electrode connected to the reference circuit 30.

The reference circuit 30 comprises an N channel IGFET 36 and a P channel IGFET 38. A first electrode of IGFET 38 is connected to a first electrode and to a control electrode of IGFET 36 to form a reference node 39 which is connected to the control electrode of IGFET 42. IGFET 38 has a second electrode connected to the power supply, $V_{DD}$. A second electrode of IGFET 36 is coupled to ground potential.

The reference node 39 is also coupled to the comparator circuit 32 which comprises an N channel IGFET 44 and a P channel IGFET 46. IGFETs 44 and 46 each have a control electrode connected to the reference node. A first electrode of IGFET 44 is connected to a first electrode of IGFET 46. A second electrode of IGFET 44 is connected to ground. A second electrode of IGFET 46 is connected to $V_{DD}$.

Logic circuit 34 comprises an inverter 48 and a NOR gate 50. The input of inverter 48 is connected to the first electrodes of IGFETs 44 and 46. The output of inverter 48 is connected to a first input of NOR gate 50. A second input of NOR gate 50 is connected to the second electrode of IGFET 42. An output of NOR 50 provides the power-on reset signal.

IGFET 38 replaces resistor 12 of the prior art shown in FIG. 1. IGFET 38 is chosen to be an order of magnitude smaller than IGFET 36 so that the reference node voltage will not increase significantly over the threshold voltage of IGFET $V_{T36}$. It is significant that IGFET 38 has its control electrode connected to ground instead of to the reference node. If it was connected to the reference node, neither IGFET 36 nor IGFET 38 would be conductive until $V_{DD}$ reached a level at least equal to the sum of the threshold voltage of IGFET 36 $V_{T36}$ and the threshold voltage of IGFET 38 $V_{T38}$ in which case the reference node voltage would be indeterminate until $V_{DD}$ reached the sum of the thresholds $V_{T38} + V_{T36}$ with the consequent indeterminate state of IGFET 44. With the control electrode connected to ground, however, IGFET 38 will turn on when $V_{DD}$ reaches the threshold voltage of IGFET 38 $V_{T38}$ at which time the voltage at the reference node will be approximately $V_{DD}$ if $V_{T38}$ is less than $V_{T36}$. If $V_{T36}$ is less than $V_{T38}$, then the reference node will be clamped at approximately $V_{T36}$ and IGFET 44 will be turned on as will IGFET 42. IGFETs 42, 44 and 36 are fabricated by conventional means to have the same threshold voltage. If $V_{T38}$ is less than $V_{T36}$, the reference node will be at $V_{DD}$ until $V_{DD}$ reaches $V_{T36}$ at which time IGFETs 42 and 44 will turn-on and the reference node will be clamped at approximately $V_{T36}$.

In the case where $V_{DD}$ rises very quickly IGFET 44 and 46 will operate in the same fashion as IGFETs 20 and 22 in FIG. 1 so that when $V_{DD}$ exceeds the sum of the thresholds of IGFETs 44 and 46, a high output will be provided to the input of inverter 48 with the inverter then providing a low to the first input of NOR gate 50. Capacitor 40 couples the increase in $V_{DD}$ to the second input of NOR gate 50 at a high level. IGFET 42, however, is on and drawing current to ground. The current drawn by IGFET 42 is the same as or scaled from the current through IGFET 36 because IGFETs 42 and 36 are matched for threshold voltage with their gains the same or scaled by conventional means. As current is drawn by IGFET 42, the voltage at the second input of NOR gate 50 will be reduced until it is only slightly above ground. The NOR gate will begin providing a high level output when it recognizes the voltage at the second input as a low level, for example, below $\frac{1}{2} V_{DD}$.

Consequently the power-on reset signal is held at a low level for at least the time it takes for IGFET 42 to reduce the voltage at the second input of NOR gate 50 from $V_{DD}$ to $\frac{1}{2} V_{DD}$. The time t is related to the current through IGFET 42 $I_{42}$, the capacitance of capacitor 40 $C_{40}$, and the change in voltage V as follows:

$$t = V C_{40}/I_{42}$$

Because the change in voltage is $\frac{1}{2} V_{DD}$ the equation becomes $$t = \frac{1}{2} V_{DD} C_{40}/I_{42}$$

The current $I_{42}$ is related to the current through IGFET 36 $I_{36}$ by the ratio of the gain of IGFET 42 $k_{42}$ to the gain of IGFET 36 $K_{36}$.

$$I_{42} = K_{42}/K_{36} I_{36}$$

The current through IGFET 36 is the same as the current through IGFET 38 $I_{38}$.

$$I_{38} = I_{36}$$

Because the IGFET 38 is in saturation, the current $I_{38}$ is approximately related to its threshold voltage $V_{T38}$ and its gain $K_{38}$ as follows:

$$I_{38} = K_{38} (V_{DD} - V_{T38})^2$$

Because $I_{36} = I_{38}$ and $I_{42} = (K_{42}/K_{36} I_{36})$
then $I_{42} = (K_{42}/K_{36}) K_{38} (V_{DD} - V_{T38})^2$ Consequently the expression for the time that the power-on reset signal is ensured of being low is $$t = \frac{\frac{1}{2} V_{DD} C_{40}}{\frac{K_{42}}{K_{36}} K_{38} (V_{DD} - V_{T38})^2}$$

Because $K_{42}/K_{36}$, $K_{38}$, $C_{40}$ and $V_{T38}$ are all a function of fabrication, the most desirable time range can be selected for a given range of $V_{DD}$. The larger $V_{DD}$ is, the less is the time delay which will be provided. This may be desirable because with a larger $V_{DD}$, the MOS circuitry responds faster.

In the case where $V_{DD}$ rises slowly compared to the minimum time, IGFET 42 holds the second input of NOR gate 50 at a low level. If $V_{T36}$ is greater than $V_{T38}$, IGFETs 36, 46 and 44 cooperate in the same manner as IGFETs 14, 20 and 22 of the prior art as shown in FIG. 1 so that a low level is provided to the input of inverter 48 when $V_{DD}$ is greater than the threshold voltage of IGFET 44 $V_{T44}$ and less than the sum of the threshold voltages of IGFET 44 $V_{T44}$ and IGFET 46 $V_{T46}$ whereas a high level is provided when $V_{DD}$ is greater than $V_{T46} + V_{T44}$. If $V_{T38}$ is greater than $V_{T36}$, the only difference is that IGFETs 42, 44 and 36 turn on when $V_{DD}$ reaches $V_{T38}$ instead of $V_{T36}$. The net effect is that the input to the inverter 48 is not assured of being at a low level until $V_{DD}$ reaches the greater of $V_{T36}$ or $V_{T38}$. A high level is provided when $V_{DD}$ is greater than $V_{T44} + V_{T46}$. With the second input of NOR gate 50 provided at a low level by IGFET 42, NOR gate 50 is effectively an inverter relative to its first input. Consequently, with effectively two inverters between the input of inverter 48 and the power-on reset signal terminal 52, a low level on the input of inverter 48 will cause the power-on reset signal to be low and a high level on the input of inverter 48 will cause the power-on reset signal to be high. Because of gain associated with conventional CMOS inverters and NOR gates a transition from low to high of the power-on reset signal will be sharper than the low level to high level transition which is provided by the comparator circuit 32 when $V_{DD}$ rises slowly.

The prior art circuit shown in FIG. 1 could be improved by replacing resistor 12 with a P channel IGFET connected as IGFET 38 is as shown in FIG. 2. Resistor 18, however, cannot be replaced in a similar manner because it couples the reference node to IGFET 20 as well as providing a timing function. By providing a separate timing circuit 28 in FIG. 2 which does not couple the reference node to the comparator circuit 32, the timing resistor 18 of FIG. 1 is eliminated.

The invention has been described in its preferred embodiment. It is noted, however, that the power-on reset circuit 26 is symmetrical, so that similar operation can be attained with supply voltage of opposite polarity simply by reversing the polarity of the transistors from N to P and vice versa. In this form, the NOR gate 50 will be transformed into a NAND gate. One of ordinary skill in the art will appreciate that there are other obvious alternatives and modifications which can be made to the invention. Accordingly, the appended claims are intended to cover all modifications of the invention which fall within the true spirit and scope of the invention.

I claim:

1. A power-on reset circuit comprising:
   reference means for receiving a supply voltage, and providing a reference voltage when the supply voltage exceeds a first threshold voltage;
   comparator means for receiving the supply voltage and the reference voltage, and providing a first signal in response to the supply voltage exceeding the reference voltage by at least a second threshold voltage;
   timer means for receiving the supply voltage and the reference voltage, and providing a second signal for a time duration related to the rate of change of the supply voltage in relation to the reference voltage; and
   logic means for receiving the first and second signals, and providing a power-on reset signal in response to receiving the first output signal in the absence of the second output signal.

2. The power-on reset circuit of claim 1 wherein the power supply voltage is characterized as being developed between a first terminal and a second terminal, and wherein the timer means comprises:
   a discharge transistor having a gate coupled to the reference voltage, a source coupled to the first terminal, and a drain; and
   a capacitor having one end thereof coupled to the second terminal, and the other end thereof coupled to the drain of the discharge transistor to form a node on which the output signal of the timer means is developed.

3. The power-on reset circuit of claim 2 wherein the reference means comprises:
   a reference transistor having a source coupled to the first terminal, and a gate and a drain connected together to form a reference node on which the reference voltage is developed; and a load transistor having a gate coupled to the first terminal, a drain coupled to the reference node, and a source coupled to the second terminal.

4. The power-on reset circuit of claim 3 wherein the comparator means comprises:

a first transistor having a gate connected to the reference node, a source coupled to the first terminal, and a drain; and a second transistor having a gate connected to the reference node, a source coupled to the second terminal, and a drain connected to the drain of the first transistor to form a node on which the output signal of the comparator means is developed.

5. The power-on reset circuit of claim 1 wherein the power supply voltage is further characterized as being developed across a first terminal and a second terminal, and wherein the reference means comprises:

a reference transistor having a source coupled to the first terminal, and a gate and a drain connected together to form a reference node on which the reference voltage is developed; and a load transistor having a gate coupled to the first terminal of the power supply voltage, a drain coupled to the reference node, and a source coupled to the second terminal.

6. A power-on reset circuit for providing a power-on reset signal in response to a power supply voltage developed across first and second terminals, comprising:

a NOR gate having first and second inputs, and an output for providing a power-on reset signal;

a first N channel IGFET having a source connected to the first terminal, and a drain and a gate connected together to form a reference node on which a reference voltage is developed;

a first P channel IGFET having a drain connected to the reference node, a gate connected to the first terminal, and a source connected to the second terminal;

a second N channel IGFET having a source connected to the first terminal, a gate connected to the reference node, and a drain;

a second P channel IGFET having a source connected to the second terminal, a gate connected to the reference node, and a drain connected to the drain of the second N channel IGFET;

a third N channel IGFET having a source connected to the first terminal, a gate connected to the reference node, and a drain connected to the first input of the NOR gate;

a capacitor having one end connected to the second terminal, and the other end connected to the drain of the third N channel IGFET; and an inverter having an input connected to the drain of the second N channel IGFET, and an output connected to the second input of the NOR gate.

* * * * *